United States Patent
Yuan et al.

(10) Patent No.: US 9,147,653 B2
(45) Date of Patent: Sep. 29, 2015

(54) METHOD FOR OFF-GRID ROUTING STRUCTURES UTILIZING SELF ALIGNED DOUBLE PATTERNING (SADP) TECHNOLOGY

(71) Applicant: GLOBALFOUNDRIES Inc., Grand Cayman (KY)

(72) Inventors: Lei Yuan, Cupertino, CA (US); Jongwook Kye, Pleasanton, CA (US); Harry Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/513,834

(22) Filed: Oct. 14, 2014

(65) Prior Publication Data
US 2015/0028489 A1    Jan. 29, 2015

Related U.S. Application Data

(62) Division of application No. 13/766,141, filed on Feb. 13, 2013, now Pat. No. 8,921,225.

(51) Int. Cl.
| | |
|---|---|
| *H01L 23/498* | (2006.01) |
| *H01L 21/308* | (2006.01) |
| *H01L 23/50* | (2006.01) |
| *H01L 21/768* | (2006.01) |
| *H01L 21/033* | (2006.01) |
| *H01L 21/311* | (2006.01) |
| *H01L 23/528* | (2006.01) |

(52) U.S. Cl.
CPC ...... *H01L 23/49838* (2013.01); *H01L 21/0337* (2013.01); *H01L 21/308* (2013.01); *H01L 21/31144* (2013.01); *H01L 21/76816* (2013.01); *H01L 21/76838* (2013.01); *H01L 23/50* (2013.01); *H01L 23/528* (2013.01); *H01L 2924/0002* (2013.01)

(58) Field of Classification Search
CPC .................................................. H01L 23/49838
USPC ........................................... 257/773, E21.586
See application file for complete search history.

(56) References Cited

U.S. PATENT DOCUMENTS

| | | |
|---|---|---|
| 2011/0113393 A1 | 5/2011 | Sezginer |
| 2012/0180014 A1 | 7/2012 | Fang et al. |
| 2014/0024209 A1* | 1/2014 | Jung et al. .............. 438/595 |
| 2014/0057436 A1 | 2/2014 | Chen et al. |
| 2014/0159164 A1* | 6/2014 | Woo et al. .............. 257/401 |

FOREIGN PATENT DOCUMENTS

| | | |
|---|---|---|
| TW | 200629093 A | 8/2006 |
| TW | 200629097 A | 8/2006 |

OTHER PUBLICATIONS

Taiwanese Office Action for related Taiwanese Patent Application No. 102134707 dated Apr. 9, 2015, 7 pages.

* cited by examiner

*Primary Examiner* — Mamadou Diallo
(74) *Attorney, Agent, or Firm* — Ditthavong & Steiner, P.C.

(57) ABSTRACT

A method for efficient off-track routing and the resulting device are disclosed. Embodiments include: providing a hardmask on a substrate; providing a plurality of first mandrels on the hardmask; providing a first spacer on each side of each of the first mandrels; providing a plurality of first non-mandrel regions of the substrate being separated from the first mandrels and between two of the first spacers, each of the first mandrels, first non-mandrel regions, and first spacers having a width equal to a distance; and providing a second mandrel having a width of at least twice the distance and being separated from one of the first non-mandrel regions by a second spacer.

20 Claims, 5 Drawing Sheets

METHOD FOR OFF-GRID ROUTING STRUCTURES UTILIZING SELF ALIGNED DOUBLE PATTERNING (SADP) TECHNOLOGY

CROSS REFERENCE TO RELATED APPLICATION

This application is a Divisional of U.S. application Ser. No. 13/766,141, filed Feb. 13, 2013 the content of which is incorporated herein by reference in its entirety.

TECHNICAL FIELD

The present disclosure relates to a fabrication of metal structures. The present disclosure is particularly applicable to fabrication of off-grid metal structures in integrated circuits (ICs) utilizing SADP technology.

BACKGROUND

In a fabrication of metal routes, particularly a fabrication of metal routes using SADP technology, metal routes are typically placed on one of many pre-determined gridded routing tracks. Such routing tracks are frequently spaced to efficiently utilize space on an IC layout and to obtain adequate performance, reliability, and manufacturability of the resulting device. However, off-grid routing may become necessary to allow flexible pin access, redundant via/via bar insertion, and metal transition. Unfortunately, traditional methods place off-grid metal islands between routing tracks, resulting in inefficient use of IC layouts utilizing SADP technology. For instance, some methods require four tracks for insertion of a single off-grid metal island between routing tracks.

A need therefore exists for methodology enabling efficient off-track routing for ICs utilizing SADP technology, and the resulting device.

SUMMARY

An aspect of the present disclosure is a method of fabricating a semiconductor device having an off-grid metal structure preventing use of two tracks by, inter alia, providing a mandrel having a width of at least a distance between pre-determined gridded routing tracks.

An aspect of the present disclosure is a method of fabricating a semiconductor device having an off-grid metal structure preventing use of three tracks by, inter alia, providing a non-mandrel region having a width of at least a distance between pre-determined gridded routing tracks.

A further aspect of the present disclosure is a device having, inter alia, a metal route positioned on one vertical position of equally spaced vertical positions (e.g., pre-determined gridded routing tracks) and extending vertically onto at least a midpoint between the one vertical position and another one of the vertical positions (e.g., an adjacent track).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a hardmask on a substrate; providing a plurality of first mandrels on the hardmask; providing a first spacer on each side of each of the first mandrels; providing a plurality of first non-mandrel regions of the substrate being separated from the first mandrels and between two of the first spacers, each of the first mandrels, first non-mandrel regions, and first spacers having a width equal to a distance; and providing a second mandrel having a width of at least twice the distance and being separated from one of the first non-mandrel regions by a second spacer and/or providing a second non-mandrel region having a width of at least twice the distance and being adjacent to at least one of the first spacers or a third spacer of a third mandrel and separated from one or more block masks.

Some aspects include a method, wherein the second mandrel is provided, the method further including: providing a fourth mandrel on the hardmask; and providing one or more spacers between the second and fourth mandrels, the one or more spacers covering an entire upper surface of the hardmask between the second and fourth mandrels. Additional aspects include providing the fourth mandrel with a width of at least the distance, and the one or more spacers with a width of twice the distance. Some aspects include a method wherein, the one or more spacers include a fourth spacer adjacent to the second mandrel and a fifth spacer adjacent to the fourth mandrel, each of the fourth and fifth spacers having a width equal to the distance. Further aspects include a method, wherein the second non-mandrel region is provided, the method further including providing one of the block masks between the second non-mandrel region and one of the first or third spacers, the block mask preventing etching of portions of the hardmask covered by the one block mask. Additional aspects include: providing the third mandrel region having a width of at least the distance and with the third spacer having a width of the distance; and providing the one block mask having a width of at least three times the distance. Further aspects include: etching the hardmask, each respective spacer of the first spacers preventing etching of one or more portions covered by the respective spacer; etching, after etching of the hardmask, the substrate, the hardmask preventing etching of portions covered by the hardmask; and forming a metal layer in recesses formed by the etching of the substrate. Some aspects include: removing the first mandrels prior to etching the hardmask, wherein a mandrel metal route is provided in a recess formed by etching a portion of the hardmask formerly covered by one of the first mandrels and a non-metal route is formed in a recess formed by etching the hardmask in one of the first non-mandrel regions.

Another aspect of the present disclosure is a device including: an IC formed on a substrate; a plurality of metal routes extending horizontally on the substrate and placed on one of a plurality of equally spaced vertical positions being separated by a distance; and a metal route of the metal routes positioned on one of the vertical positions and extending vertically onto at least a midpoint between the one vertical position and another vertical position.

Aspects include a second metal route of the metal routes being positioned on a second vertical position of the vertical positions adjacent to the one vertical position. Some aspects include a third metal route of the metal routes being positioned on a third vertical position of the vertical positions being within three vertical positions from the one vertical position, the second and third vertical positions being on opposite sides of the one vertical position. Further aspects include the metal routes being formed by either a mandrel metal or a non-mandrel metal of a SADP technology, wherein metal routes formed by a mandrel metal are separated from each other by at least one vertical position and metal routes formed by a non-mandrel metal are separated from each other by at least one vertical position. Additional aspects include the third metal route of the metal routes being positioned on a vertical position three vertical positions from the one vertical position when the one metal route is formed by a non-mandrel metal and positioned on a vertical position two vertical positions from the one vertical position when the one metal route is formed by a mandrel metal. Further aspects include the metal routes being within a M1 or M2 layer of the IC. Some aspects include the metal route being connected to another metal layer via a redundant via, a pin access, or a metal transition region. Additional aspects include a device, wherein the distance is a multiple of a critical distance associated with one or more masks fabricating the IC.

Another aspect of the present disclosure is a method including: providing a hardmask on a substrate; providing a plurality of first mandrels on the hardmask; providing a first spacer on each side of each of the first mandrels; providing a plurality of first non-mandrel regions of the substrate being separated from the first mandrels and between two of the first spacers, each of the first mandrels, first non-mandrel regions, and first spacers having a width equal to a distance; providing a second mandrel having a width of at least twice the distance and having a second spacer adjacent to one of the first non-mandrel regions and/or providing a second non-mandrel region having a width of at least twice the distance and being adjacent to at least one of the first spacers or a third spacer of a third mandrel and separated from one or more block masks; removing the first mandrels after providing the first spacers; etching the hardmask, each respective spacer of the first spacers preventing etching of one or more portions covered by the respective spacer; etching the substrate, after etching of the hardmask, the hardmask preventing etching of portions covered by the hardmask; and forming a metal layer in recesses formed by the etching of the substrate.

Aspects include a method, wherein the second mandrel is provided, the method further including: providing a fourth mandrel having a width of at least the distance; and providing one or more spacers between the second and fourth mandrels, the one or more spacers covering an entire upper surface of the hardmask between the second and third mandrels and having a width of twice the distance. Some aspects include a method, wherein the one or more spacers include a fourth spacer adjacent to the second mandrel and a fifth spacer adjacent to the fourth mandrel. Further aspects include a method, wherein the second non-mandrel region is provided, the method further including: providing the third spacer and the third mandrel having widths of at least the distance; and providing one of the block masks between the second non-mandrel region and either the one first spacer or the third spacer, the one block mask having a width of three times the distance and preventing an etching of portions of the hardmask covered by the one block mask.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of layout inefficiency attendant upon devices utilizing off-track routing structures. In accordance with embodiments of the present disclosure, a mandrel is formed having a width of at least a distance between tracks. Additionally, or alternatively, a non-mandrel region is formed having a width of at least a distance between tracks.

Methodology in accordance with embodiments of the present disclosure includes: providing a hardmask on a substrate; providing a plurality of first mandrels on the hardmask; providing a first spacer on each side of each of the first mandrels; providing a plurality of first non-mandrel regions of the substrate being separated from the first mandrels and between two of the first spacers, each of the first mandrels, first non-mandrel regions, and first spacers having a width equal to a distance; and providing a second mandrel having a width of at least twice the distance and being separated from one of the first non-mandrel regions by a second spacer and/or providing a second non-mandrel region having a width of at least twice the distance and being adjacent to at least one of the first spacers or a third spacer of a third mandrel and separated from one or more block masks.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
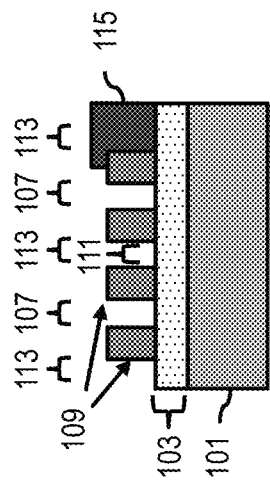
FIGS. 1A through 1D schematically illustrate sequential steps of forming metal routes on pre-determined gridded routing tracks.
Figure 1B:
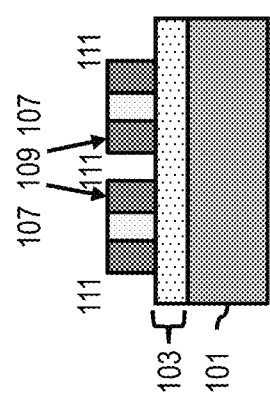
Figure 1C:
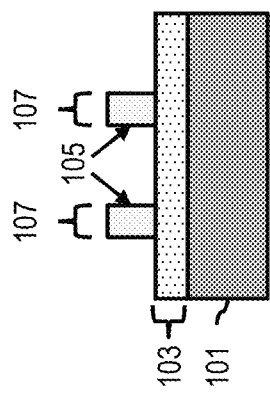
Figure 1D:
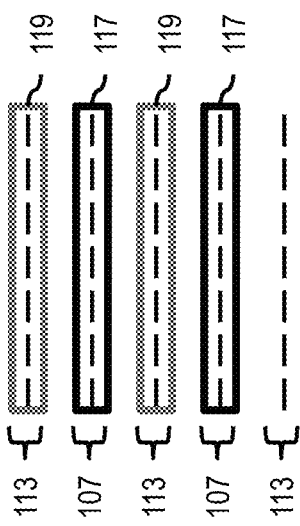

Adverting to FIG. 1A, a substrate 101 is provided with hardmask 103 and mandrels 105 being placed on mandrel tracks 107. Next, as illustrated in FIG. 1B, spacers 109 are formed on each side of each of the mandrels 105. As shown, the spacers 109 separate mandrels 105 from non-mandrel regions 111 and the mandrels 105, spacers 109, and non-mandrel regions 111 have equal widths. The mandrels 105 are removed in FIG. 1C, resulting in the spacers 109 separating mandrels tracks 107 from non-mandrel tracks 113. Additionally, a block mask 115 is placed in a non-mandrel track 113. Next, as shown in FIG. 1D, mandrel metal routes 117 are formed in regions of the substrate 101 formerly covered by mandrels 105 and non-mandrel metal routes 119 are formed in non-mandrel regions 111. That is, mandrel metal routes 117 and non-mandrel metal routes 119 are placed in recesses formed by etching exposed portions of the hardmask 103 and into the substrate 101 below those exposed portions. As shown, the spacers 109 and block mask 115 prevent etching of other portions of the hardmask 103 and substrate 101.

Figure 1E:
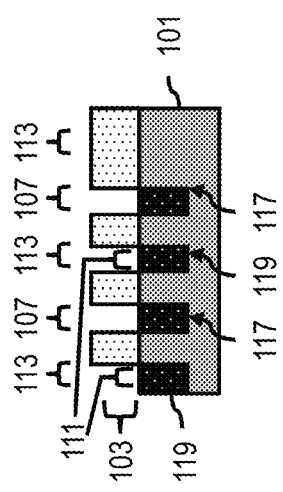
FIG. 1E schematically illustrates metal routes on pre-determined gridded routing tracks formed using the steps illustrated in FIGS. 1A through 1D.

FIG. 1E schematically illustrates metal routes on pre-determined gridded routing tracks formed using the steps illustrated in FIGS. 1A through 1D. As shown, mandrel metal routes 117 are formed on mandrel tracks 107 and non-mandrel metal routes 119 are formed on non-mandrel tracks 113. Additionally, the block mask 115 has prevented a forming of a non-mandrel metal route 119 on one of the non-mandrel tracks 113. Block masks (e.g. 115) may also prevent a forming of mandrel metal routes (e.g., 117). Further, the mandrel and non-mandrel metal routes 117 and 119, respectively, have equal widths and are separated by equal distances. Such equal widths and distances may correspond to a critical distance associated with one or more masks for fabrication of an IC. For example, the mandrel and non-mandrel metal routes 117 and 119 may have widths equal to a multiple of a critical distance associated with one or more masks fabricating the IC. Additionally, each pair of mandrel metal routes 117 is separated by at least one non-mandrel track 113 and each pair of non-mandrel metal routes 119 is separated by at least one mandrel track 107. The metal routes (e.g., 117 and 119) may be within a M1 or M2 layer of an IC.

Figure 2B:
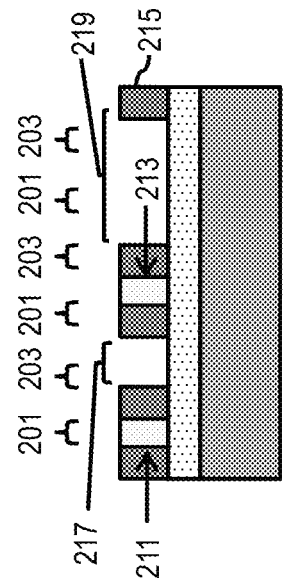
FIGS. 2B through 2D schematically illustrate sequential steps of forming the exemplary off-track mandrel metal route illustrated in FIG. 2A.
Figure 2D:
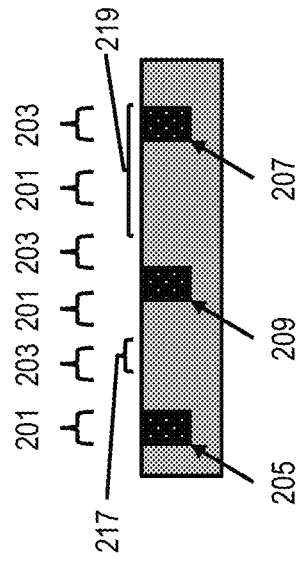
Figure 2A:
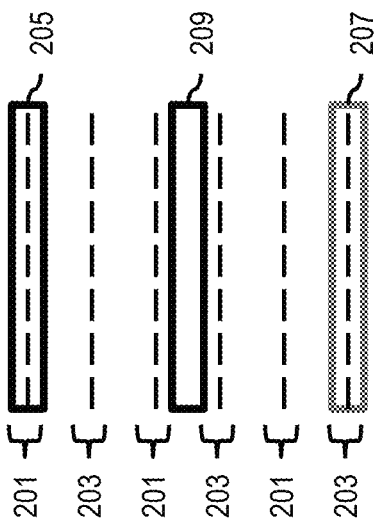
FIG. 2A schematically illustrates an exemplary off-track mandrel metal route.

FIG. 2A schematically illustrates an exemplary off-track mandrel metal route. As shown, mandrel tracks 201 and non-mandrel tracks 203 contain mandrel metal route 205 and non-mandrel metal route 207, respectively, and an off-track mandrel metal route 209 is between one of the mandrel tracks 201 and one of the non-mandrel tracks 203. As noted above, off-track routes (e.g., 209) may allow flexible pin access, redundant via/via bar insertion, and metal transition, for instance, by, being connected to another (e.g., upper) metal layer via a redundant via, a pin access, or a metal transition region.

Figure 2C:
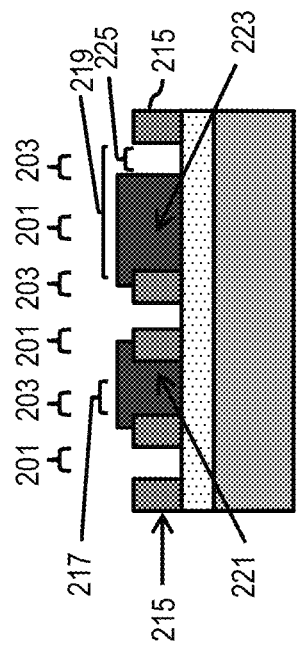

FIGS. 2B through 2D schematically illustrate sequential steps of forming the exemplary off-track mandrel metal route illustrated in FIG. 2A. Adverting to FIG. 2B, on-track mandrel 211 and off-track mandrel 213 are provided with spacers 215 on each side. A positioning and width of off-track mandrel 213 results in a first region 217 and a second region 219, each extending beyond non-mandrel tracks 203. First region 217 has a width greater than a non-mandrel region. Therefore, a block mask would be required to cover the remainder of first region 217 to prevent unwanted subsequent etching of the hardmask and substrate thereunder. However, a block mask has a minimum width that exceeds the difference between the first region and a non-mandrel region. Therefore, a block mask 221 must cover the entire first region 217, as shown in FIG. 2C. Similarly, no on-track mandrel (e.g., 211) can be provided within the second region 219, as the space between off-track mandrel 213 and an on-track mandrel 211 would not be large enough for a spacer to be formed for each mandrel. However, since the difference between the second region 219 and a non-mandrel region is larger than a block mask minimum width, a block mask may be formed only in a portion of second region 219, leaving an opening for non-mandrel region 225.

Adverting to FIG. 2D, the mandrels are removed, and mandrel metal route 205 is formed in a recess formerly covered by mandrel 211, non-mandrel route 207 is formed in non-mandrel region 225, and off-track mandrel metal route 209 is formed in a region formerly covered by off-track mandrel 213. Therefore, the positioning and width of off-track mandrel 213 prevent a placement on two of the mandrel tracks 201 and on two of the non-mandrel tracks 203.

Figure 3A:
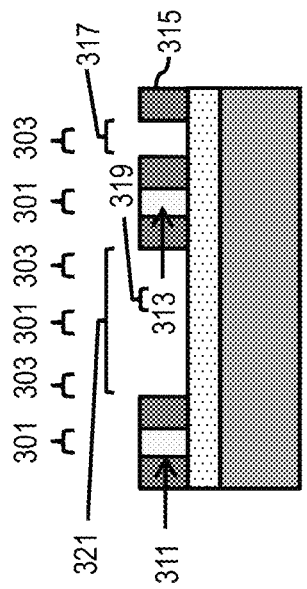
FIG. 3A schematically illustrates an exemplary off-track non-mandrel metal route.

FIG. 3A schematically illustrates an exemplary off-track non-mandrel metal route. As shown, mandrel tracks 301 and non-mandrel tracks 303 contain mandrel metal route 305 and non-mandrel metal route 307, respectively, and an off-track non-mandrel metal route 309 is between one of the mandrel tracks 301 and one of the non-mandrel tracks 303.

Figure 3B:
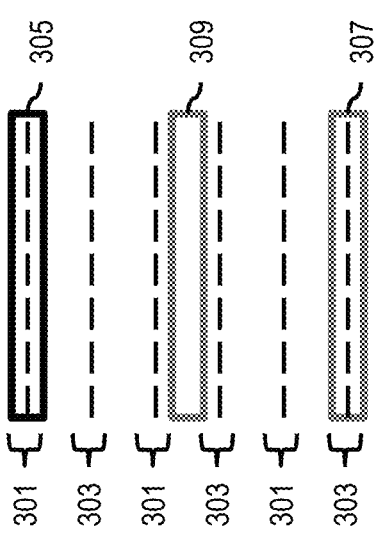
FIGS. 3B through 3D schematically illustrate sequential steps of forming the off-track non-mandrel metal route illustrated in FIG. 3A.
Figure 3C:
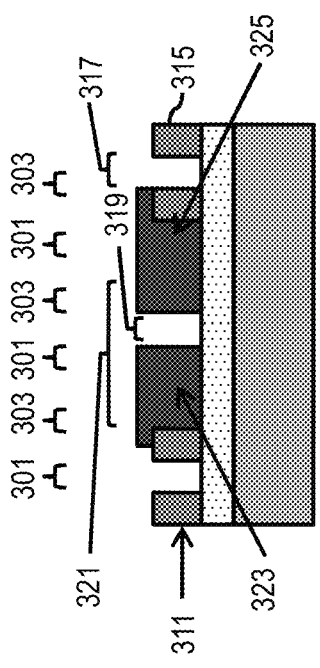
Figure 3D:
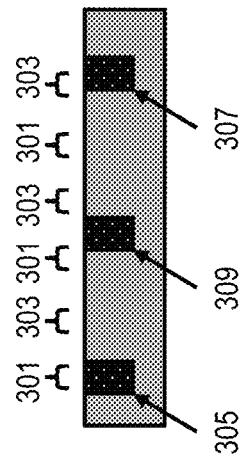

FIGS. 3B through 3D schematically illustrate sequential steps of forming the off-track non-mandrel metal route illustrated in FIG. 3A. Adverting to FIG. 3B, on-track mandrels 311 and 313 are provided with spacers 315 on each side. A first non-mandrel region 317 is provided adjacent to one of the spacers 315 of the mandrel 313. However, the positioning of off-track non-mandrel metal route 309 into non-mandrel region 319 forms a space between spacer 315 and non-mandrel region 319 which would need to be covered by a block mask. However, the space is smaller than a block mask minimum width. Therefore, no mandrel metal route may be formed. As such, mandrel 313 and the spacer closest to region 319 are removed, and block mask 325 is formed as shown in FIG. 3C. In addition, the space between non-mandrel region 319 and spacer 315 of mandrel 311 precludes formation of an on-track non-mandrel metal route (e.g. 307) between off-track non-mandrel metal route 309 and mandrel metal route 305. Therefore, a block mask 323 is formed, as shown in FIG. 3C.

Adverting to FIG. 3D, the mandrel is removed, and mandrel metal route 305 is formed in a recess formerly covered by mandrel 311, non-mandrel route 307 is formed in non-mandrel region 317, and off-track non-mandrel metal route 309 is formed in non-mandrel region 319. However, the positioning and width of off-track non-mandrel metal route 309 prevent a placement on two of the mandrel tracks 301 and on two of the non-mandrel tracks 303.

Figure 4B:
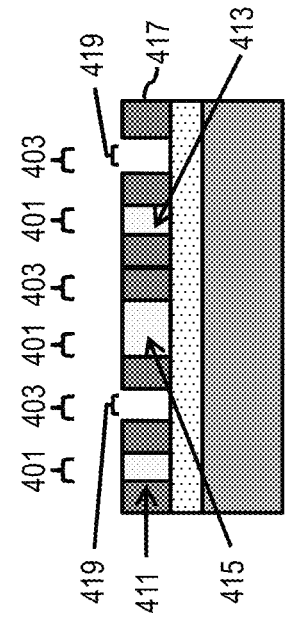
FIGS. 4B through 4D schematically illustrate sequential steps of forming the off-track mandrel metal route illustrated in FIG. 4A in accordance with an exemplary embodiment.
Figure 4D:
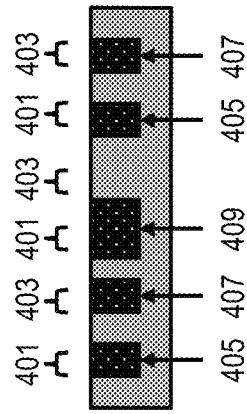
Figure 4A:
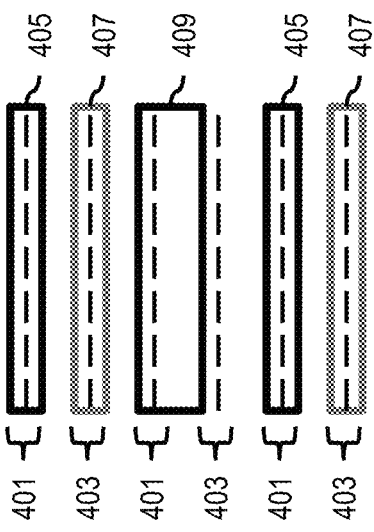
FIG. 4A schematically illustrates an exemplary off-track mandrel metal route in accordance with an exemplary embodiment.

FIG. 4A schematically illustrates an exemplary off-track mandrel metal route, in accordance with an exemplary embodiment. As shown, mandrel tracks 401 and non-mandrel tracks 403 contain mandrel metal routes 405 and non-mandrel metal routes 407, respectively, and an off-track mandrel metal route 409 is positioned on one of the mandrel tracks 401 and extends onto at least a midpoint between the one of the mandrel tracks 401 and one of the non-mandrel tracks 403. As shown, the off-track mandrel metal route 409 has a width of twice of a width of each of the mandrel metal routes 405 and the non-mandrel metal routes 407.

Figure 4C:
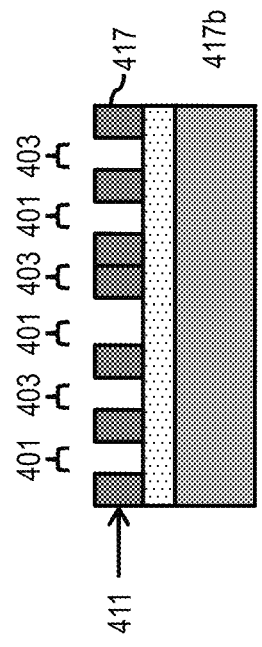

FIGS. 4B through 4D schematically illustrate sequential steps of forming the off-track mandrel metal route illustrated in FIG. 4A, in accordance with an exemplary embodiment. Adverting to FIG. 4B, on-track first and second mandrels 411 and 413, respectively, and off-track mandrel 415 are provided with spacers 417 on each side. The off-track mandrel 415 is positioned and sized such that a spacer 417 on one side of the mandrel 415 abuts a boundary of a non-mandrel region 419 and a spacer 417 on the other side abuts a spacer 417 for the second mandrel 413. As such, no block mask is needed to separate the off-track mandrel 415 from the non-mandrel region 419. Furthermore, spacers 417 cover an entire upper surface between the off-track mandrel 415 and on-track second mandrel 413. As such, no block mask is required to cover a region between off-track mandrel 415 and on-track second mandrel 413. As illustrated in FIG. 4C, mandrels 411, 413, and 415 are removed. Adverting to FIG. 4D, mandrel metal routes 405 are formed in recesses formerly covered by mandrels 411 and 413, non-mandrel routes 407 are formed in non-mandrel regions 419, and off-track mandrel metal route 409 is formed in a region formerly covered by off-track mandrel 415. As such, the extending of a width of the off-track mandrel 415 allows a positioning of spacers 417 to prevent a forming of an unwanted space between spacers 417 and non-mandrel regions 419. Thus, no block masks are necessary and the placement of the off-track mandrel 415 only prevents a placement of metal routes on one of the mandrel tracks 401 and on one of the non-mandrel tracks 403, thereby saving two tracks.

Figure 5A:
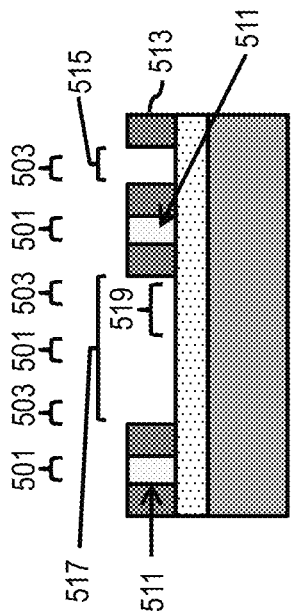
FIG. 5A schematically illustrates an exemplary off-track non-mandrel metal route in accordance with an exemplary embodiment.

FIG. 5A schematically illustrates an exemplary off-track non-mandrel metal route, in accordance with an exemplary embodiment. As shown, mandrel tracks 501 and non-mandrel tracks 503 contain mandrel metal routes 505 and non-mandrel metal route 507, respectively, and an off-track non-mandrel metal route 509 is positioned on one of the non-mandrel tracks 503 and extends onto at least a midpoint between the one of the non-mandrel tracks 503 and one of the mandrel tracks 501. As shown, the off-track non-mandrel metal route 509 has a width of twice of a width of each of the mandrel metal routes 505 and the non-mandrel metal routes 507.

Figure 5C:
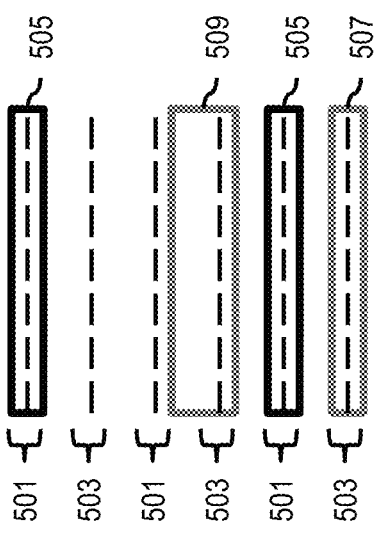
FIGS. 5B through 5D schematically illustrate sequential steps of forming the off-track non-mandrel metal route illustrated in FIG. 5A in accordance with an exemplary embodiment.
Figure 5B:
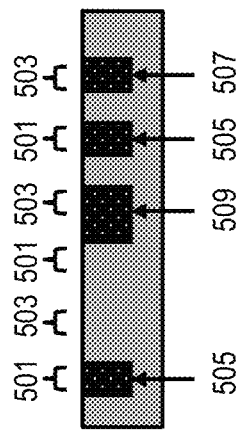
Figure 5D:
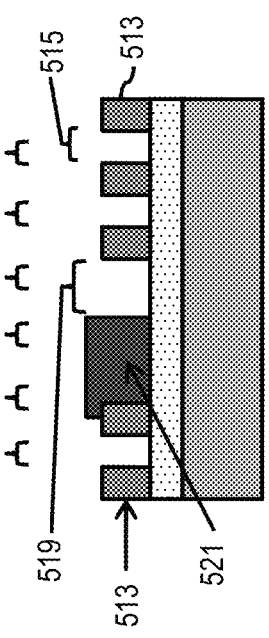

FIGS. 5B through 5D schematically illustrate sequential steps of forming the off-track non-mandrel metal route illustrated in FIG. 5A, in accordance with an exemplary embodiment. Adverting to FIG. 5B, on-track mandrels 511 are provided with spacers 513 on each side. As shown, a spacer 513 of one of the on-track mandrels 511 is adjacent to the non-mandrel region 519. As such, no block mask is needed to prevent etching of a portion between the non-mandrel region 519 and a spacer 513. However, region 517 extends beyond the non-mandrel region 519. As such, a block mask 521 is provided in FIG. 5C, to form non-mandrel region 519. Adverting to FIG. 5D, mandrel metal routes 505 are formed in recesses formerly covered by mandrels 511, a non-mandrel route 507 is formed in non-mandrel region 515, and off-track non-mandrel metal route 509 is formed in non-mandrel region 519. As such, the extending of a width of the non-mandrel region 519 allows use of only a single block mask (e.g., block mask 521). Thus, the placement and width of the off-track non-mandrel route 509 only prevents a placement on one of the mandrel tracks (e.g. 501) and on two of the non-mandrel tracks (e.g. 503), thereby saving a track.

The embodiments of the present disclosure can achieve several technical effects including off-track metal structures preventing a placement on no more than three tracks, resulting in an improved layout efficiency of a resulting design. The present disclosure enjoys industrial applicability in any of various types of highly integrated semiconductor devices, particularly in IC devices utilizing SADP technology.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
an integrated circuit (IC) formed on a substrate;
a plurality of metal routes extending horizontally on the substrate and placed on one of a plurality of equally spaced vertical positions being separated by a distance; and
a metal route of the metal routes positioned on one of the vertical positions and extending vertically onto at least a midpoint between the one vertical position and another vertical position.

2. The device according to claim 1, further comprising:
a second metal route of the metal routes being positioned on a second vertical position of the vertical positions adjacent to the one vertical position.

3. The device according to claim 2, further comprising:
a third metal route of the metal routes being positioned on a third vertical position of the vertical positions being within three vertical positions from the one vertical position, the second and third vertical positions being on opposite sides of the one vertical position.

4. The device according to claim 3, further comprising:
the metal routes being formed by either a mandrel metal or a non-mandrel metal of a self-aligned-double-patterning (SADP) technology, wherein metal routes formed by a mandrel metal are separated from each other by at least one vertical position and metal routes formed by a non-mandrel metal are separated from each other by at least one vertical position.

5. The device according to claim 4, further comprising:
the third metal route of the metal routes being positioned on a vertical position three vertical positions from the one vertical position when the one metal route is formed by a non-mandrel metal and positioned on a vertical position two vertical positions from the one vertical position when the one metal route is formed by a mandrel metal.

6. The device according to claim 1, further comprising:
the metal routes being within a M1 or M2 layer of the IC.

7. The device according to claim 6, further comprising:
the metal route being connected to another metal layer via a redundant via, a pin access, or a metal transition region.

8. The device according to claim 1, wherein the distance is a multiple of a critical distance associated with one or more masks fabricating the IC.

9. A device comprising:
a hardmask on a substrate;
a plurality of first mandrels on the hardmask;
a first spacer on each side of each of the first mandrels;
a plurality of first non-mandrel regions of the substrate being separated from the first mandrels and between two of the first spacers, each of the first mandrels, first non-mandrel regions, and first spacers having a width equal to a distance;

a second mandrel having a width of at least twice the distance and having a second spacer adjacent to one of the first non-mandrel regions and/or providing a second non-mandrel region having a width of at least twice the distance and being adjacent to at least one of the first spacers or a third spacer of a third mandrel and separated from one or more block masks;

wherein the first mandrels are removed after providing the first spacers;

wherein the hardmask is etched and each respective spacer of the first spacers prevents etching of one or more portions covered by the respective spacer;

wherein the substrate is etched after etching of the hardmask, the hardmask preventing etching of portions covered by the hardmask; and a metal layer in recesses formed by the etching of the substrate.

10. The device according to claim 9, further comprising:
a fourth mandrel having a width of at least the distance; and
one or more spacers between the second and fourth mandrels, the one or more spacers covering an entire upper surface of the hardmask between the second and third mandrels and having a width of twice the distance.

11. The device according to claim 10, wherein the one or more spacers comprise a fourth spacer adjacent to the second mandrel and a fifth spacer adjacent to the fourth mandrel.

12. The method according to claim 9, wherein the second non-mandrel region is provided, the method further comprising:
providing the third spacer and the third mandrel having widths of at least the distance; and
providing one of the block masks between the second non-mandrel region and either the one first spacer or the third spacer, the one block mask having a width of three times the distance and preventing an etching of portions of the hardmask covered by the one block mask.

13. A device comprising:
a hardmask on a substrate;
a plurality of first mandrels on the hardmask;
a first spacer on each side of each of the first mandrels;
a plurality of first non-mandrel regions of the substrate being separated from the first mandrels and between two of the first spacers, each of the first mandrels, first non-mandrel regions, and first spacers having a width equal to a distance; and a second mandrel having a width of at least twice the distance and being separated from one of the first non-mandrel regions by a second spacer and/or providing a second non-mandrel region having a width of at least twice the distance and being adjacent to at least one of the first spacers or a third spacer of a third mandrel and separated from one or more block masks.

14. The device according to claim 13, further comprising:
a fourth mandrel on the hardmask; and
one or more spacers between the second and fourth mandrels, the one or more spacers covering an entire upper surface of the hardmask between the second and fourth mandrels.

15. The device according to claim 14, wherein the fourth mandrel has a width of at least the distance, and the one or more spacers has a width of twice the distance.

16. The device according to claim 15, wherein the one or more spacers comprise a fourth spacer adjacent to the second mandrel and a fifth spacer adjacent to the fourth mandrel, each of the fourth and fifth spacers having a width equal to the distance.

17. The device according to claim 13, further comprising:
one of the block masks between the second non-mandrel region and one of the first or third spacers, the block mask preventing etching of portions of the hardmask covered by the one block mask.

18. The device according to claim 17, wherein the third mandrel region has a width of at least the distance and the third spacer has a width of the distance; and
the one block mask has a width of at least three times the distance.

19. The method according to claim 13, wherein
the hardmask is etched, and each respective spacer of the first spacers prevents etching of one or more portions covered by the respective spacer;
the substrate is etched after etching of the hardmask, the hardmask preventing etching of portions covered by the hardmask; and
a metal layer formed in recesses formed by the etching of the substrate.

20. The device according to claim 19, wherein
the first mandrels are removed prior to etching the hardmask; and
a mandrel metal route provided in a recess formed by etching a portion of the hardmask formerly covered by one of the first mandrels and a non-metal route is formed in a recess formed by etching the hardmask in one of the first non-mandrel regions.

* * * * *